United States Patent
Folsom et al.

(10) Patent No.: US 10,752,986 B2
(45) Date of Patent: Aug. 25, 2020

(54) METHOD OF MANUFACTURING A THREE-DIMENSIONAL CARBON STRUCTURE

(71) Applicant: Savannah River Nuclear Solutions, LLC, Aiken, SC (US)

(72) Inventors: Matthew D Folsom, Aiken, SC (US); John T Bobbitt, III, Evans, GA (US); Aaron L Washington, II, Aiken, SC (US); Josef A Velten, Augusta, GA (US)

(73) Assignee: Savannah River Nuclear Solutions, LLC, Aiken, SC (US)

(*) Notice: Subject to any disclaimer, the term of this patent is extended or adjusted under 35 U.S.C. 154(b) by 0 days.

(21) Appl. No.: 15/797,710

(22) Filed: Oct. 30, 2017

(65) Prior Publication Data
US 2019/0127840 A1 May 2, 2019

(51) Int. Cl.
| | | |
|---|---|---|
| *B05D 3/06* | (2006.01) | |
| *C23C 14/06* | (2006.01) | |
| *C01B 32/186* | (2017.01) | |
| *C01B 32/184* | (2017.01) | |
| *C01B 32/182* | (2017.01) | |

(52) U.S. Cl.
CPC ........ *C23C 14/0605* (2013.01); *C01B 32/182* (2017.08); *C01B 32/184* (2017.08); *C01B 32/186* (2017.08); *C01B 2204/04* (2013.01)

(58) Field of Classification Search
CPC ... C23C 14/0605; C23C 14/28; C01B 32/184; C01B 32/192; C01B 32/194; C01B 2204/04
USPC ....... 427/553, 554, 555, 556, 558, 559, 596, 427/249.7
See application file for complete search history.

(56) References Cited

U.S. PATENT DOCUMENTS

| | | | |
|---|---|---|---|
| 6,080,470 A | 6/2000 | Dorfman | |
| 9,738,827 B1* | 8/2017 | Zidan | C09K 11/65 |
| 10,343,916 B2* | 7/2019 | Banerjee | C01B 32/23 |
| 10,416,108 B2* | 9/2019 | Sommer | G01N 27/304 |
| 2005/0163985 A1 | 7/2005 | Dorfman | |
| 2009/0297854 A1 | 12/2009 | Lee et al. | |
| 2011/0059599 A1* | 3/2011 | Ward | H01L 29/1606 |
| | | | 438/507 |
| 2011/0269629 A1 | 11/2011 | Giustino et al. | |
| 2013/0033343 A1* | 2/2013 | Fisher | H01J 23/36 |
| | | | 333/252 |
| 2013/0040283 A1* | 2/2013 | Star | B82Y 30/00 |
| | | | 435/5 |
| 2013/0156678 A1* | 6/2013 | Banerjee | B82Y 30/00 |
| | | | 423/445 R |
| 2014/0322608 A1* | 10/2014 | Claussen | H01M 4/587 |
| | | | 429/224 |
| 2015/0151973 A1 | 6/2015 | Lee et al. | |
| 2015/0311064 A1* | 10/2015 | Stuart | H01S 3/08095 |
| | | | 438/584 |
| 2016/0016805 A1 | 1/2016 | Fray et al. | |
| 2016/0073488 A1* | 3/2016 | Stuart | G21G 4/06 |
| | | | 315/506 |
| 2016/0115032 A1* | 4/2016 | Wodtke | C01B 31/0461 |
| | | | 252/71 |
| 2016/0203942 A1* | 7/2016 | Russo | B08B 7/0035 |
| | | | 250/307 |
| 2017/0113936 A1* | 4/2017 | Zhang | B01J 23/745 |
| 2017/0259554 A1* | 9/2017 | Whitener | H01J 37/00 |
| 2018/0130897 A1* | 5/2018 | Friedman | H01L 21/041 |
| 2019/0088420 A1* | 3/2019 | Tour | H01M 4/587 |
| 2019/0103599 A1* | 4/2019 | Aitchison | H01M 4/133 |
| 2019/0376925 A1* | 12/2019 | Choi | C12Q 1/6869 |
| 2020/0010324 A1* | 1/2020 | Velten | B01J 19/127 |

FOREIGN PATENT DOCUMENTS

| | | | |
|---|---|---|---|
| CN | 105036106 | 11/2015 | |
| JP | 2000 178070 | 6/2000 | |
| WO | WO 2015/072926 A1 | 5/2014 | |
| WO | WO 2015/159080 A1 | 10/2015 | |
| WO | WO 2017/165369 A1 * | 9/2017 | ............. C03C 17/22 |

OTHER PUBLICATIONS

R.Z. Li et al.; "High-great in-plane micro-supercapacitors scribed onto photo paper using in situ femtolaser-reduced graphene oxide/Au nanoparticles microelectrodes"; Energy & Environmental Science, Royal Society of Chemistry; vol. 9; Feb. 11, 2016; pp. 1458-1467.*
Yong-Lai Zhang et al.; "Photoreduction of Graphene Oxides: Methods, properties, and Applications"; Advanced Optical Materials; vol. 2; pp. 10-28; 2014 (no month).*
Ka Hing Cheng et al.; "LASER Light Scribe and Microwave Annealing Reduction of Graphene Oxide for Supercapacitor Applications"; Nano/Micro Engineered and Molecular Systems (IEEE-NEMS 2015); Apr. 7-11 2015; pp. 380-383.*
A. Furio et al.; "Light irradiation tuning of surface wettability, optical, electrical properties of graphene oxide thin films"; Nanotechnology, vol. 28, 054003(10pp); Dec. 23, 2016.*
Kiran Kumar Manga et al.; "Multilayer Hybrid Films Consisting of Alternating Graphene and Titania Nanosheets with Ultrafast Electron Transfer and Photoconversion Properties"; Advanced Functional Materials; vol. 19; 2009 (no month); pp. 3638-3643.*
L. Jiao et al.; "Laser Scribe Graphene for Energy Storage Application"; Opto-Electronics and Communications conference Jun. 28-Jul. 2, 2015;; published Dec. 3, 2015 in IEEE Xplore, 3 pages.*
Maher F. El Kady et al.; Direct Laser Writing of Graphene Electronics; ACS Nano; vol. 8, No. 9; pp. 8725-8729; 2014 (no month).*
Byung-Seon Kong et al.; Layer-by-layer assembly of graphene and gold nanoparticles by vacuum filtration and spontaneous reduction of gold ions; Chem. Communications, the Royal Society of chemistry; pp. 2174-2176; Feb. 26, 2009.*

(Continued)

*Primary Examiner* — Marianne L Padgett
(74) *Attorney, Agent, or Firm* — Dority & Manning, P.A.

(57) ABSTRACT

The present invention is directed to a method of manufacturing a three-dimensional carbon structure. The method requires graphene layers and/or graphene oxide layers. The layers can be provided such that they correspond to the cross-section of a pre-defined shape. In this regard, the method of the present invention can be employed to manufacture a three-dimensional carbon structure having a custom shape.

18 Claims, No Drawings

(56) References Cited

OTHER PUBLICATIONS

Nina I Kovetyukhova et al.; "Layer-by-Layer Assembly of Ultrathin Composite Films from Micron-capsized Graphite Oxide Sheets and Polycations"; Chemical Matters; vol. 11, pp. 771-778; published on web Jan. 28, 1999.*
Morteza Hassanpour Amiri et al.; "Flexible micro supercapacitors based on laser-scribed graphene/ZnO nanoconnposite"; Journal of nanoparticles research; vol. 18, 237(14pp); published online Aug. 12, 2016.*
He Tian et al.; "Scalable fabrication of high-performance and flexible graphene strain sensors"; nanoscale; communication; Royal Society of chemistry; 2014, vol. 6; pp. 699-750; published online Oct. 23, 2013.*
L. Zyga; "First observation made of quantum-tunneling diffusion of hydrogen atoms on ice"; retrieved from the website //phys.org/news/2015-10-quantum-tunneling-diffusion-hydrogen-atoms-ice. HTML; 4 pages; Oct. 1, 2015.*
Schäfer et al.; "Hydrogen Tunneling above Room Temperature Evidenced by Infrared Ion Spectroscopy" ; Journal of the American chemical Society 2017, 139, pp. 5779-5786; Mar. 10, 2017.*
Kohen et al.; "Hydrogen tunneling in biology", a review article; Chemistry & Biology, vol. 6, No. 7; Jul. 1999; pp. R191-R198.*
G.M. Roberts et al.; "Direct Observation of Hydrogen Tunneling Dynamics in Photoexcited Phenol"; The Journal of Physical Chemistry, Letters; 2012, 3, pp. 348-352; Jan. 12, 2012.*
"Electron tunneling model of the covalent bond"; from website //www.chem1.com/acad/webtut/bonding/TunnelBond.html, retrieved May 29, 2020 & last updated Feb. 27, 2007; 5 pages.*
Hao Fatt Teoh et al.; "Direct laser-enabled graphene oxide-reduced graphene oxide layered structures with micropatterning"; Journal of applied physics vol. 112 (6) pp. 064309-1 to 064309-6; published online Sep. 19, 2012.*
Haifu Huang et al.; "UV-assisted reduction of graphene oxide on Ni foam as high performance electrode for supercapacitors"; Carbon vol. 107 (2016), pp. 917-924; published online Jun. 30, 2016.*
Wei Gao et al.; "Direct laser writing of micro-supercapacitors on hydrated graphene dioxide films"; Nature Nanotechnology, Letters; vol. 6; Aug. 2011, pp. 496-500.*
Trusovas et al.; "Reduction of graphite oxide to graphene with laser irradiation"; Carbon, vol. 52 (2013) pp. 574-578; published online Oct. 23, 2012.*
Sinar et al.; "Laser micro-machining of oxygen reduced graphene-oxide films"; proceedings SPIE 8973, Micro-machining and Microfiber acacia and Process Technology XIX, 89730K (10 pages); Mar. 7, 2014.*
Badzian, et al. "Synthesis of diamond from methane and nitrogen mixture," Appl. Phys. Lett. vol. 62, No. 26; pp. 3432-3434; Jun. 28, 1993.
Acocella et al., "Quantum Study of Laser-Induced Initial Activation of Graphite-to-Diamond Conversion", Journal of the American Chemical Society, vol. 132, No. 35, 2010, pp. 12166-12167; (no month).
Angus, et al., "Chemical vapour deposition of diamond", Philosophical Transactions of the Royal Society a Mathematical, Physical and Engineering Sciences, 1993, pp. 195-208; vol. 342; (no month).
Eng et al., "Highly Hydrogenated Graphene through Microwave Exfoliations of Graphite Oxide in Hydrogen Plasma: Towards Electrochemical Applications", Chemistry, A European Journal, 2013, pp. 15583-15592; vol. 19; published online Oct. 7, 2013.
Li et al., "A Review on the Low-Dimensional and Hybridized Nanostructured Diamond Films", Journal of Nanomaterials, vol. 2015, Jul. 1, 2015, 16 pages, Article ID 692562.
Paper—Elias, et al. "Control of graphene's properties by reversible hydrogenation", 2009.
Aung, Theint, "Making Graphene-Based Supercapacitors by LightScribe", 8 pages.
Gnida, Manuel, "Science with Bling: Turning Graphite into Diamond," Mar. 27, 2004.
SLAC national acceleration laboratory; News Feature Archive; 3 pages; online www6.slac.Stanford.edu/news/.

* cited by examiner

METHOD OF MANUFACTURING A THREE-DIMENSIONAL CARBON STRUCTURE

FEDERAL RESEARCH STATEMENT

This invention was made with Government support under Contract No. DE-AC09-08SR22470, awarded by the U.S. Department of Energy. The Government has certain rights in the invention.

BACKGROUND OF THE INVENTION

Synthetic three-dimensional carbon structures, such as diamonds, have excellent properties and characteristics in comparison to other allotropes of carbon, in part, due to the manner in which the carbon atoms are arranged. These properties include excellent mechanical properties, electrical properties, optical properties, and thermal conductivity, among many other desirable features. As a result, these structures can be employed in numerous scientific and industrial applications, such as in tools as cutting and wear-resistant materials, transmission windows, sensing and imaging applications for optoelectronics and semiconductors, nuclear applications, as well as in medical implants and drug delivery applications.

Typical processes for manufacturing these structures require the application of high pressure on graphite, which consists of graphene layers. The force exerted on the graphene sheets can reconfigure their atomic structure into a stable, three-dimensional structure. However, the force necessary can be greater than one hundred thousand times atmospheric pressure, which raises safety concerns. In addition, manufacturing these structures using such processes requires substantial capital and equipment as a result of such safety concerns.

Moreover, current manufacturing processes limit the ability to control and/or fine tune a three-dimensional carbon structure. For instance, current processes are limited in their ability to control the atom by atom position of carbon in the molecule and thus their ability to generate novel structures that could include various additives strategically positioned within the structure.

As a result, there is a need for an improved process for manufacturing a three-dimensional carbon structure. In particular, there is a need for an improved process for manufacturing a three-dimensional carbon structure that allows for control of the shape and/or configuration of the final structure.

SUMMARY OF THE INVENTION

Aspects and advantages of the invention will be set forth in part in the following description, or may be apparent from the description, or may be learned through practice of the invention.

In accordance with one embodiment of the present invention, a method of manufacturing a three-dimensional carbon structure is disclosed. The method comprises the following: (a) providing a first graphene oxide layer, (b) converting at least a portion of the first graphene oxide layer to provide a first graphene layer, (c) providing a second graphene oxide layer on the first graphene layer, the first graphene oxide layer, or a combination thereof, (d) converting at least a portion of the second graphene oxide layer to provide a second graphene layer, and (e) exposing the first graphene layer and the second graphene layer to a gas comprising hydrogen.

In accordance with another embodiment of the present invention, a three-dimensional carbon structure made according to the methods provided herein is disclosed.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally speaking, one embodiment of the present invention is directed to a method of manufacturing a three-dimensional carbon structure. For instance, in one embodiment, the structure may be an ordered three-dimensional carbon structure. In general, the present inventors have discovered that the method disclosed herein can provide a three-dimensional carbon structure having a custom shape. In this regard, the shape, as well as other properties, and the composition of the three-dimensional carbon structure can be tailored. For instance, the structure can be tailored for a specific application.

In general, the three-dimensional carbon structures can be made from graphene oxide and/or graphene. In one embodiment, the method disclosed herein begins with graphene oxide as the starting material for forming the three-dimensional carbon structures. In another embodiment, the method disclosed herein begins with graphene as the starting material for forming the three-dimensional carbon structures. In one embodiment, the method disclosed herein begins with graphene oxide that is converted to graphene for forming the three-dimensional carbon structures. In another embodiment, the method disclosed herein employs both graphene layers and graphene oxide layers for forming the three-dimensional carbon structures.

As is generally known in the art, graphene is a one-atom thick nanosheet composed of a hexagonal structure of carbon atoms. As is also generally known in the art, such one atom thick sheet may also be referred to as single layer graphene. Additionally, as is generally known in the art, graphene oxide is a sheet of carbon atoms that can be densely covered with hydroxyl groups and other groups.

According to one embodiment of the present invention, a first graphene layer is provided. For instance, the first graphene layer can be provided by converting a first graphene oxide layer. Accordingly, a first graphene oxide layer can be provided that is then converted to graphene. As disclosed herein, the entire graphene oxide layer can be converted to graphene or select portions of the graphene oxide layer can be converted to graphene. Accordingly, at least some of the graphene oxide layer is converted to graphene. In an embodiment wherein some of the graphene oxide is converted to graphene, the graphene oxide and the graphene may be in the same layer. For instance, the layer may include graphene oxide and graphene.

According to one particular embodiment of the present invention, the first graphene layer is provided on a substrate. In one embodiment, the substrate may be any substrate that is capable of forming bonds with the graphene layer. In one embodiment, the bonds are chemical bonds between the substrate and the graphene layer.

In one embodiment, the substrate may be a metallic substrate or a non-metallic substrate. In one particular embodiment, the substrate is a metallic substrate. In another embodiment, the substrate is a non-metallic substrate. In another embodiment, the substrate is a non-metallic substrate having a metallic coating.

In one embodiment, the substrate comprises lead, silicon, silicon oxide, copper, stainless steel, platinum, palladium, gold, iron, nickel, and the like. In one particular embodiment, the metallic substrate comprises lead, silicon, copper, stainless steel, platinum, palladium, gold, iron, nickel, and the like. In one particular embodiment, the metallic substrate comprises platinum and/or nickel. In one particular embodiment, the metallic substrate comprises platinum. In another particular embodiment, the metallic substrate comprises nickel. In another particular embodiment, the substrate comprises silicon. In another embodiment, the metallic coating on the non-metallic substrate comprises any of the aforementioned metals.

In one embodiment, the substrate is a non-metallic substrate. For instance, in one embodiment, the substrate is a diamond.

However, upon completion of the three-dimensional structure, the substrate can be removed from the three-dimensional structure. In general, the substrate can be removed using any method known in the art that can sever the chemical bonds between the substrate and the first graphene layer adjacent to the substrate.

According to the method of the present invention, the graphene layer is then exposed to a hydrogen gas. Without intending to be limited by theory, such exposure can alter the structure of the graphene into a three-dimensional carbon structure via a process generally known in the art as hydrogen tunneling. In one embodiment, without intending to be limited by theory, it is believed that the hydrogen can also create chemical bonds between the bottom layer of graphene and a substrate, which can allow the three-dimensional structure to be stable.

Without intending to be limited by theory, it is believed that during hydrogen tunneling, the tunneling results in a loss of an electron from the graphene which allows for the formation of a bond, such as between graphene layers, in particular adjacent graphene layers.

Such exposure to hydrogen gas can be conducted at any pressure capable of altering the structure. For instance, the pressure can range from 14.5 psi to 2500 psi. In general, the hydrogen may be applied as an over-pressure in an inert glovebox. However, it should be understood that other methods may be employed as well.

When the starting material is graphene oxide, the grapheme oxide can be provided on the aforementioned substrate. Thereafter, at least some of the graphene oxide can be converted to graphene. Then, the graphene can be exposed to hydrogen gas as mentioned above.

According to one embodiment of the present invention, a second graphene layer is provided on the first graphene layer. For instance, the second graphene layer can be provided by converting a second graphene oxide layer. Accordingly, a second graphene oxide layer can be provided on the first graphene layer, the first graphene oxide layer, or a combination thereof that is then converted to graphene. As disclosed herein, the entire second graphene oxide layer can be converted to graphene or select portions of the second graphene oxide layer can be converted to graphene. Accordingly, at least some of the second graphene oxide layer is converted to graphene. In an embodiment wherein some of the graphene oxide is converted to graphene, the graphene oxide and the graphene may be in the same layer. For instance, the layer may include graphene oxide and graphene.

After providing the second graphene layer, it can then also be exposed to hydrogen gas. Accordingly, when present, the first graphene layer can be exposed to hydrogen gas when on a substrate. Alternatively, the exposure to hydrogen gas can be after the second graphene layer is provided on the first graphene layer.

While the above mentions a first layer and a second layer, it should be understood that any number of graphene layers may be employed according to the present invention. For instance, the three-dimensional carbon structure can be manufactured from at least two graphene layers. In general, the present invention is not limited in the number of graphene layers employed. For instance, the method disclosed herein can also include a third graphene and/or graphene oxide layer, a fourth graphene and/or graphene oxide layer, a fifth graphene and/or graphene oxide layer and so forth.

In addition, when providing multiple graphene layers, unless if specified, the exposure to hydrogen gas may occur after providing each graphene layer or alternatively after providing all of the graphene layers. In one embodiment, the exposure to hydrogen gas occurs after providing each graphene layer. In another embodiment, exposure to hydrogen gas occurs after providing multiple graphene layers or all of the graphene layers. For instance, in one embodiment, the first graphene layer and the second graphene layer are exposed to hydrogen gas simultaneously in one step.

It should be understood that the graphene layers may be produced by any method generally known in the art. According to one particular embodiment of the present invention, the graphene layer is obtained from a graphene oxide layer. In this regard, first a one-atom thick carbon layer of graphene oxide is provided and the layer can then be reduced to graphene. Thus, when providing a graphene layer according to the present invention, in such embodiment, a graphene oxide layer is provided and thereafter converted to graphene.

In general, the graphene oxide may be provided using any method generally known in the art. For instance, the graphene oxide layer can be applied or formed from an aqueous solution, electrostatically, or conventional powder rakes. In general, it is a sheet that is one atom thick.

The reduction of graphene oxide to graphene can be conducted using any method generally known in the art. In particular, the reduction can be conducted using any method that allows for selective control of the areas upon which the graphene oxide is converted to graphene. The present inventors have discovered that such control can allow for the manufacture of a three-dimensional carbon structure having a custom or desired shape and/or composition.

For instance, when reducing the graphene oxide to graphene, the reduction can be done in a manner such that the area upon which the graphene oxide is converted to graphene corresponds to a cross-section of a pre-defined shape. In this regard, each graphene layer, and the area upon which the graphene oxide is converted to graphene, can correspond to a cross-section of a pre-defined shape. Thus, by layering such graphene oxide and graphene layers, a three-dimensional carbon structure having a custom shape can be manufactured.

In one embodiment, the reduction of graphene oxide to graphene is conducted via a laser. For example, the conversion may be done via picosecond pulse laser direct writing in liquid nitrogen. In general, without being limited by theory, the laser can excite the graphene oxide in a manner sufficient to cause a reduction reaction and conversion to graphene. Such reaction would result in the removal of oxygen. In general, the power and frequency required to undergo the conversion can change together according to the absorption bandwidth of the graphene oxide.

In one embodiment, the reduction of graphene oxide to graphene can be conducted using an electron beam. In general, without being limited by theory, the electron beam can excite the graphene oxide in a manner sufficient to cause a reduction reaction and conversion to graphene. Such reaction would result in the removal of oxygen.

However, it should be understood that other methods may also be employed to convert graphene oxide to graphene. For instance, in one embodiment, the conversion may be conducted using gamma ray irradiation as generally known in the art. Alternatively, in another embodiment, the conversion may be conducted using UV irradiation. Nevertheless, it should be understood that the particular process for converting the graphene oxide to graphene may not necessarily be limited.

According to one embodiment of the present invention, upon conversion of the graphene oxide to graphene, the remaining graphene oxide can be removed. For instance, graphene oxide is soluble in water. Accordingly, exposing the structure or an intermediate and/or the graphene oxide can result in the removal of any graphene oxide that has not been converted to graphene. However, while this is one method, it should be understood that any method known in the art for removing any remaining graphene oxide may be employed.

According to another embodiment of the present invention, a first graphene oxide layer is provided. The first graphene oxide layer is converted to a first graphene layer. Then, a second graphene oxide layer is provided and then the second graphene oxide layer is converted to a second graphene layer. Thereafter, the graphene layers may be exposed to hydrogen gas as mentioned herein. For instance, the exposure may be after the addition of each subsequent graphene layer. In another embodiment, the exposure may be after the addition of multiple graphene layers or all of the graphene layers. As mentioned herein, upon conversion of the graphene oxide to graphene, the remaining graphene oxide can be removed.

According to one embodiment of the present invention, the method disclosed herein can be employed to embed other atoms, referred to herein as contaminants, into the three-dimensional carbon structure. In general, a contaminant refers to a non-carbon atom within the three-dimensional structure. In one embodiment, the contaminant does not include hydrogen. It is understood that such contaminants can be employed to tailor the properties, such as the conductivity, the mechanical properties, and/or the color of the resulting structure. However, it should be understood that other properties can also be tailored by employing such contaminants.

In one embodiment, the method disclosed herein requires a step of exposing a graphene layer to a contaminant. In one embodiment, the contaminant may be nitrogen, boron, nickel, iron, a halogen, such as fluorine or chlorine, or the like.

In one embodiment, the contaminant may be a gas. For instance, in one embodiment, the contaminant may be nitrogen. In another embodiment, the contaminant may be a halogen, such as fluorine or chlorine.

In general, the contaminants are present during the creation of the graphene layer and/or the hydrogen tunneling. The contaminants can be introduced layer by layer and vary between layers, if desired. In one embodiment, one layer may contain multiple colors. For instance, graphene oxide can be reduced to graphene over part of the surface in the presence of a first contaminant. Thereafter, hydrogen tunneling can be employed, possibly still with the contaminant present. Once complete, then a different area of the graphene oxide can be reduced to graphene in the presence of a second contaminant. Thereafter, hydrogen tunneling can be employed. Such steps can be performed any desired number of times for a given layer.

Such additives or contaminants can be incorporated into the structure using any method generally known in the art. For instance, in general, a gaseous additive can be added with overpressure over a period of time. For a liquid or metal additive, dissolution or ball milling techniques can be employed. Additionally, even synthetic type of heating or sintering would allow metals to infuse into a graphite lattice.

In general, without intending to be limited by theory, it is believed that the contamination may be where carbon atoms are substituted by other atoms and/or where the contaminants bond to the carbon bonds. For instance, in one embodiment, the contamination may be where carbon atoms are substituted by other atoms. In another embodiment, the contamination may be such that the atoms bond to the carbon atoms. For instance, regarding the latter method, such a structure may have contaminants (or atoms) as intercalating materials between graphene layers.

In one embodiment, beta radiation may be employed. For instance, the first graphene layer, the second graphene layer, or both may be exposed to beta radiation. In particular, such radiation can be employed to provide a green color. In general, conversion and tunneling can be conducted in the presence of a beta source in order to provide the aforementioned color.

The present inventors have discovered that by employing such contaminants, the final color, clarity, magnetic properties, and fluorescence of the structure can also be altered. For instance, the color can be modified from clear to yellow, brown, blue, or the like by employing dopants.

While most conversions require high temperatures and high pressures, the present inventors have discovered a method that allows for the manufacture of a three-dimensional carbon structure at ambient temperature. For instance, the method can be performed between a temperature range of 15° C. and 32° C., such as 18° C. and 30° C., such as 20° C. and 26° C. However, it should be understood that the method can also be employed at various other temperatures and is not simply limited to ambient temperature.

The method disclosed herein can provide a three-dimensional carbon structure having a custom shape. The custom shape can be made from graphene layers and in particular graphene oxide layers that have been converted to graphene layers. For instance, as mentioned herein, the custom shape can result from the selective conversion of the graphene oxide to graphene.

In general, in one embodiment, the individual layers of the three-dimensional carbon structure comprise $sp^2$ bonded layers. In one embodiment, the individual layers are bonded together via $sp^3$ hybridization to provide a three-dimensional diamond-like framework. In one embodiment, the individual layers of the three-dimensional carbon structure comprise $sp^2$ bonded layers and the individual layers are bonded together via $sp^3$ hybridization to provide a three-dimensional diamond-like framework. In general, the term diamond like framework refers to a three-dimensional, predominantly $sp^3$ carbon network chemically bonded with graphene layers which penetrate through the whole structure.

In one embodiment, the concentration of $sp^2$ carbon-carbon bonds in the structure is about 20 atomic % to about 80 atomic %, such as from about 30 atomic % to about 55 atomic % of the sum of the carbon-carbon bonds in the structure. In one embodiment, the concentration of $sp^3$ carbon-carbon bonds in the structure comprises from about 20 atomic % to about 80 atomic %, such as from about 45 to about 70 atomic % of the sum of carbon-carbon bonds in the structure.

In one embodiment, the three-dimensional carbon structure contains primarily carbon atoms. For instance, the structure contains carbon in an amount of more than 90 atomic %, such as 92 atomic % or more, such as 95 atomic % or more, such as 97 atomic % or more based on the total number of atoms in the structure.

Upon formation of the structure and exposure to hydrogen gas (e.g., hydrogen tunneling), the three-dimensional carbon structure may undergo post-processing. For instance, the structure may be processed to include a diamond-like carbon coating. In this regard, the structure may include a diamond-like surface finish. The diamond-like carbon coating may be provided using any method as generally known in the art. For instance, in one embodiment, the coating may be provided using pulsed laser deposition. As is generally known in the art, pulsed laser deposition is a physical vapor disposition technique that employs a pulsed laser beam (e.g., a high-power beam) that is focused inside a vacuum chamber to strike a target of the material that is to be deposited. In general, the material is vaporized from the target and then deposits as a thin film on the substrate. For such process, the target may be any such material (e.g., graphite) that allows for the transmission of carbon cations onto the surface of the substrate and the formation of a diamond-like carbon coating. In another embodiment, the diamond-like carbon coating may be formed by chemical vapor deposition. Regardless of the deposition method, such deposition allows for the presence of a carbon coating that can be both hard and have a low coefficient of friction.

However, it should also be understood that the aforementioned vapor deposition may be employed during any part of the method disclosed herein. For instance, upon conversion of at least part of a first graphene oxide layer to graphene, the aforementioned vapor deposition may be employed to provide a diamond-like coating on such graphene layer. Such method may also allow for the formation of a higher quality film and structure.

According to the present inventors, the method disclosed herein can provide many advantages over those of the prior art. In particular, the method disclosed herein can provide a flexible method of manufacturing three-dimensional carbon structures. In particular, the method can be employed to manufacture a structure having a pre-defined shaped. Accordingly, the method can be employed to manufacture a custom shaped three dimensional structure.

Accordingly, the method disclosed herein can be employed to manufacture structures specifically for a variety of applications. For instance, these structures can be employed in numerous scientific and industrial applications, such as in tools as cutting and wear-resistant materials, transmission windows, sensing and imaging applications for optoelectronics and semiconductors, nuclear applications, electronic devices, electrochemical sensors, as well as in medical implants and drug delivery applications. In one particular embodiment, the structures can be employed for optical applications, such as for optic lens covers, as well as other types of lenses and screens. Such method may also be employed to manufacture custom jewelry, such as custom rings. The structures can also be employed to include electrical circuity, such as electrical paths, as the graphene can be electrically conductive.

In addition, the methods disclosed herein can provide other advantages as well. For instance, the method can provide a reduction in unused materials. In addition, the method can also be employed to reduce the amount of time required to produce the three-dimensional carbon structures.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

The invention claimed is:

1. A method of manufacturing a three-dimensional carbon structure, the method comprising steps of:
providing a first graphene oxide layer on a metallic substrate,
converting at least a portion of the first graphene oxide layer to provide a first graphene layer in a first converting step,
providing a second graphene oxide layer on the first graphene layer, the first graphene oxide layer, or a combination thereof,
converting at least a portion of the second graphene oxide layer to provide a second graphene layer in a second converting step producing an initial carbon structure,
exposing the first graphene layer and the second graphene layer to a hydrogen gas at a pressure sufficient to alter the initial carbon structure and cause hydrogen tunneling, and
removing the metallic substrate after the second converting step and the exposing step to provide the three-dimensional carbon structure.

2. The method of claim 1, wherein the metallic substrate comprises a transition metal.

3. The method of claim 1, wherein the metallic substrate comprises silicon, platinum, iron, or nickel.

4. The method of claim 1, wherein the metallic substrate comprises platinum.

5. The method of claim 1, wherein at least one of the steps of converting is performed with a laser.

6. The method of claim 1, wherein at least one of the steps of converting is performed via gamma ray irradiation or UV irradiation.

7. The method of claim 1, wherein the first graphene layer, the second graphene layer, or both include at least some unconverted graphene oxide and wherein the method further comprises a step of removing the at least some of the unconverted graphene oxide.

8. The method of claim 1, wherein the three-dimensional carbon structure contains a contaminant comprising nitrogen, boron, nickel, iron, or a halogen.

9. The method of claim 8, wherein the contaminant replaces a carbon in the first graphene layer, the second graphene layer, or both.

10. The method of claim 8, wherein the contaminant is present between the first graphene layer and the second graphene layer.

11. The method of claim 8, wherein the contaminant comprises nitrogen.

12. The method of claim 8, wherein the contaminant comprises a halogen.

13. The method of claim 8, wherein the contaminant comprises boron, nickel, or iron.

14. The method of claim 1, wherein the first graphene layer, the second graphene layer, or both are exposed to a contaminant comprising nitrogen, boron, nickel, iron, or a halogen during exposure to the hydrogen gas.

15. The method of claim 1, wherein the first graphene oxide layer is exposed to a contaminant comprising nitrogen, boron, nickel, iron, or a halogen during the first converting step.

16. The method of claim 1, further comprising a step of exposing the first graphene layer, the second graphene layer, or both to beta radiation.

17. The method of claim 1, further comprising a step of forming a diamond-like carbon coating on the three-dimensional carbon structure.

18. The method of claim 17, wherein the coating is formed using pulsed laser deposition.

\* \* \* \* \*